United States Patent [19]

Erickson et al.

[11] 4,002,975

[45] Jan. 11, 1977

[54] ELECTRO-OPTIC MEASUREMENT OF VOLTAGE ON HIGH-VOLTAGE POWER LINES

[75] Inventors: Dennis C. Erickson, Beaverton; Gail A. Massey, Cornelius, both of Oreg.

[73] Assignee: The United States of America as represented by the Secretary of the Interior, Washington, D.C.

[22] Filed: Feb. 26, 1976

[21] Appl. No.: 661,465

[52] U.S. Cl. .................................. 324/96; 324/51
[51] Int. Cl.² ...................................... G01R 31/00
[58] Field of Search ................... 324/96, 51, 43 L

[56] References Cited

UNITED STATES PATENTS

| | | | |
|---|---|---|---|
| 3,466,541 | 9/1969 | Bernard et al. | 324/96 |
| 3,597,683 | 8/1971 | Saito et al. | 324/96 |
| 3,605,013 | 9/1971 | Yoshikawa et al. | 324/96 |
| 3,675,123 | 7/1972 | Hermstein et al. | 324/96 |
| 3,675,125 | 7/1972 | Jaecklin | 324/96 |
| 3,746,983 | 7/1973 | Renz | 324/96 |

*Primary Examiner*—Stanley T. Krawczewicz
*Attorney, Agent, or Firm*—Thomas Zack; Donald R. Fraser

[57] ABSTRACT

Crystals which vary the polarization of a beam of light according to the intensity of the electrical or magnetic field in the crystal are placed in the vicinity of a high-voltage power line. A laser beam is directed from an elctrically isolated position through the crystal and is reflected to the isolated position. The change in polarization of the returned beam is measured to indicate the intensity of the field. Temperature measurement and thermal compensation are provided because of temperature variations in the polarization modulation coefficient of the crystals.

10 Claims, 9 Drawing Figures

ELECTRO-OPTIC MEASUREMENT OF VOLTAGE ON HIGH-VOLTAGE POWER LINES

BACKGROUND OF THE INVENTION

1. Field of the Invention

The invention relates to the measurement of voltage and current in a high-voltage power transmission line from a position which is electrically isolated from the line by electro-optical means.

2. Description of the Prior Art

U.S. Pat. No. 3,466,541 (Bernard et al.) teaches the use of a crystal of KDP as a Pockels cell in an electrical (i.e. voltage-gradient) field to measure the intensity of the voltage on a high-voltage line. U.S. Pat. No. 3,605,013 (Yoshikawa et al.) teaches the use of a particular glass fiber as a Faraday cell for measuring a magnetic (i.e. Gaussian) field about a high voltage line. U.S. Pat. No. 3,675,125 (Jaecklin) teaches the use of a Pockels cell and a Faraday cell in combination to measure the power in a high-voltage line. U.S. Pat. No. 3,597,683 (Saito et al.) teaches the use of a Faraday effect element to measure the intensity of a magnetic field in the vicinity of a high-voltage line.

None of these references teaches the use of any temperature compensation to compensate for temperature variations in the sensing elements. There is a very large temperature coefficient in the KDP-type elements, which are the best Pockels-effect sensors. A change in temperature from 45° F. (7° C.) to 65° F. (18° C.) would cause an estimated 6% error in readings from a KD*P crystal. The Faraday-effect sensors are less sensitive to temperature variations, but they can also benefit from temperature compensation.

Only Saito teaches a device which can be physically and electrically isolated from the line, which is a practical necessity when dealing with lines in the range of 500 kV. None of the references teaches the use of the devices with filters to measure transients, which are such short-term effects that temperature compensation can be ignored.

SUMMARY OF THE INVENTION

The present invention allows the measurement of the electrical potential on high-voltage power lines from a position on the ground which is totally electrically isolated from the power lines. No power-operated equipment is needed in the vicinity of the power lines.

Any operating power line causes an electric field and a magnetic field in the vicinity of the line. On high-voltage power lines, these fields are quite sizeable. Assuming a 5 inch diameter line 23 feet above the ground at 500 kV peak-to-peak carrying 1000 amperes, the magnetic field at the surface of the line has an H value of about 2500 amperes/meter and a B value of 31.5 gauss ($3.15 \times 10^{-3}$ webers/m$^2$), and the electric field E has a value of about 7300 volts/cm. At 10 feet below the line, $B \simeq 0.6$ gauss and $E \simeq 220$ v/cm. At 0.5 ft., $E \simeq 5000$ v/cm and at 1.0 ft., $E \simeq 2200$ v/cm.

The invention relies upon the fact that an accurate measurement of the electrical and magnetic field at a given distance from a line of fixed dimensions is as good as a measurement of the voltage and current values on the line. There are sensing materials which exhibit the Pockels effect by inducing polarization variations in light passing through it as a function of the electric field surrounding the materials. There are other sensing materials which exhibit the Faraday effect by inducing similar polarization variations as a function of the magnetic field surrounding the materials. There are other effects, such as Kerr Electro-Optic, Stark, and Electrostriction, which cause other sensing materials to react as a function of the electric field, and such as Kerr Magneto-Optic, Cotton Moulton, Voigt, Zeeman, and Magnetostriction, which cause still other sensing materials to react as a function of the magnetic field. While these other effects might provide useful embodiments of the present invention, the preferred embodiment uses the Pockels effect for sensing electric fields and the Faraday effect for sensing magnetic fields.

The preferred materials for use with the Pockels effect are chosen from among a group of KDP-like crystals, the group including KDP (potassium dihydrogen phosphate), ADP (ammonium dihydrogen phosphate), KD*P (deuterated potassium dihydrogen phosphate or potassium dideuterium phosphate) and CsD*A (deuterated cesium dihydrogen arsenate or cesium dideuterium arsenate). Of these, the presently most preferred is KD*P, although CsD*A is excluded principally because of its great cost.

The preferred crystal materials for use with the Faraday effect are chosen from among a group of rare-earth iron garnets, such as YIG ($Y_3Fe_5O_{12}$, yttrium iron garnet), or possibly $GdPr_2Ga_{0.5}Fe_{4.5}O_{12}$, or it may be silicate glass doped with a rare earth such as terbium. One such terbium-doped glass is sold as FR-5 glass by Hoya Optics, U.S. of Menlo Park, Calif. The rare earth elements include all those of atomic number 57 to 71, inclusive: namely, lanthanum, cerium, praseodymium, neodymium, promethium, samarium, europium, gadolinium, terbium, dysprosium, bolmium, erbium, thulium, ytterbium, and lutetium.

In various embodiments of the present invention, one of these KDP-type crystals or Faraday-effect crystals is placed in the vicinity of the power line in order to be subjected to the fields created around the line. A laser is used to direct light through a polarizer and into the crystal, where the polarized light is rotated. Mirrors are provided in the vicinity of the crystal to direct the rotated light through a polarization analyzer to a pair of photodiodes. The photodiodes are connected to a differential amplifier, which provides an output signal indicative of the rotation of the laser beam by the crystal.

Since the crystal is preferably cut so that the maximum rotation in the expected fields is no more than about 40°, perhaps even no more than 5°, the signal output from the differential amplifier provides a single non-repetitive value corresponding to the strength of the field. This signal provides an indication of the strength of the fields.

Because the KDP-type crystals are very temperature sensitive, some form of temperature compensation must be provided if the measured results are required to have any significant accuracy in their absolute value. There are several forms of temperature measurement that can be used without any electrical contact between the high-voltage level and the necessary electrical equipment used for monitoring. The presently preferred device is a thermostatic beam deflector in which a beam is constructed of a two-layer sandwich of dielectric materials of two different coefficients of thermal expansion. This deflector bends in the presence of temperature changes in the same fashion as a bimetallic strip, but is not a conductor. On the free end of the beam is mounted a mirror. When a laser beam is directed at the mirror, the reflected beam moves across a ground-mounted sensor as a function of temperature. In addition, the temperature of the crystal can be maintained at a constant or nearly constant value by directing radiant energy or heated gas (such as $SF_6$) at the crystal in response to temperatures sensed by the thermostatic beam.

When a device according to the present invention is used to sense transients rather than to measure actual values, no temperature compensation is needed, because no significant temperature change could occur in the time allowed for an electrical transient.

Since the Pockels effect and Faraday effect devices are polarization modulators and photodetectors are sensitive only to optical intensity modulation, the polarization variations induced by the sensor are usually converted to intensity variations by passing the light through a polarizing beam splitter, or analyzer, which separates the polarization components into two beams that can be sensed by a pair of photodetectors. The two beams of light leaving the analyzer can be transformed into two photocurrents $I_1$ and $I_2$ of the form:

$$\begin{matrix} I_1(\Gamma) = I_o(\frac{1}{2} - \frac{1}{2}\sin\Gamma) \\ I_2(\Gamma) = I_o(\frac{1}{2} + \frac{1}{2}\sin\Gamma) \end{matrix} \bigg\} \text{Pockels Effect} \quad (1)$$

$$\begin{matrix} I_1(\theta) = I_o(\frac{1}{2} - \frac{1}{2}\sin 2\theta) \\ I_2(\theta) = I_o(\frac{1}{2} + \frac{1}{2}\sin 2\theta) \end{matrix} \bigg\} \text{Faraday Effect} \quad (2)$$

where $I_o$ is the current one detector would produce if the full beam power were incident on it, $\Gamma$ is the relative phase retardation (in radians) induced by the electric field due to the Pockels effect, and $\theta$ is the polarization rotation induced by the magnetic field due to the Faraday effect.

If noise is present on the light beam, due to the effects within the laser source or propagation effects such as air turbulence or mirror vibrations, the value $I_o$ in the above equations is no longer constant, but varies with time and produces the same effect as variations in $\Gamma$ or $\theta$ as far as one Photodetector is concerned. By using two detectors, obtaining $I_1$ and $I_2$, and by suitable processing, all or most of the effect of variations in $I_o$ can be eliminated. Note that by summing the two currents, $I_1 + I_2$, $I_o$ is obtained, independent of $\Gamma$ or $\theta$, and by taking the difference $I_2 - I_1 = I_o \sin\Gamma$ or $I_o \sin 2\theta$ is obtained. Then, forming the ratio $$(I_2 - I_1)/(I_1 + I_2) = \begin{bmatrix} \sin\Gamma \text{ (Pockels)} \\ \text{or} \\ \sin 2\theta \text{ (Faraday)} \end{bmatrix} \quad (3)$$

the quantities of interest are obtained with no dependence on the light level $I_o$. This requires a double-detector, differential-mode processor, which is used in the present invention.

Note that if $\Gamma$ or $2\theta$ is much less than one radian (the case for linear sensing), then $$I_2 - I_1 \begin{bmatrix} I_o\Gamma \text{ (Pockels)} \\ 2I_o\theta \text{ (Faraday)} \end{bmatrix} \quad (4)$$

and $$\frac{I_2 - I_1}{I_2 + I_1} \begin{bmatrix} \Gamma \text{ (Pockels)} \\ 2\theta \text{ (Faraday)} \end{bmatrix} \quad (5)$$

Thus if $I_1$ contains a small fluctuation $\Delta I$, i.e., $$I_1 = I_o' + \Delta I \quad 6.$$

where $I_o'$ is constant, then Eqn (4) becomes $$I_2 - I_1 \begin{bmatrix} I_o'\Gamma + \Delta I\Gamma \text{ (Pockels)} \\ 2I_o'\theta + 2\Delta I\theta \text{ (Faraday)} \end{bmatrix} \quad (7)$$

Thus, in a differential receiver which does not divide out the intensity $I_o$, the desired signal (the first term on the right) is larger than the noise (second term) by the ratio $I_o'/\Delta I$, which can be made as large as 100/1 using a low-noise laser. Also, unless $\Delta I$ originates in an effect synchronized with the power line (such as laser power supply modulation which can be eliminated with good design), the time variations of $\Delta I$ and $\Gamma$ or $\theta$ will not be correlated and their product will tend to average out to zero over several cycles. Finally, if $\Delta I$ does fluctuate at the line frequency with a stable amplitude, it will produce only a steady harmonic frequency that can be calibrated out. These conditions would apply for the case of a perfectly balanced differential preamplifier driven by the two photodetectors, with no divider circuit. In practice, however, it is never possible to balance both channels perfectly, and a small portion of the $\frac{1}{2} I_o$ terms in Eqns. (1) and (2) will show up in the output. If $\Gamma$ or $2\theta$ is about 0.1, then an overall accuracy of 0.1% with a 1% uncorrelated-noise-modulated $I_o$ (i.e., $\Delta I/I_o' \approx 0.01$) requires that the overall gain in the channels should be balanced to about 1%, that is, the common-mode photocurrent rejection should be about 40 db below the desired signal gain. If the balance itself is subject to rapid drift or jitter (e.g., as a result of laser beam position changes on the photodetectors caused by vibration or turbulence) then the amplitude of the jitter component must be kept below about 0.01% of the full light level (or rejected by 80 db in the detector circuit) for the above values of accuracy and $\Gamma$. Since circuit values do not fluctuate at rates comparable to the signal, this requirement falls entirely on the optical system and propagation conditions.

The temperature coefficient of the Pockels effect in KD*P was found to be −0.54% per ° C and nearly constant over the range 21° C to 88° C. The temperature coefficient of one Faraday rotating rare earth iron garnet YIG is nearly zero at −40 C and decreases to approximately −0.1% per ° C at +60° C. It is worth nothing that a YIG magnetic sensor could operate within ± 40° C of room temperature with an accuracy of ± 5% with no thermal compensation at all. For our present goals of 0.3% to 0.1% accuracy, however, some compensation is needed, particularly at the higher temperatures.

A method of sensing and compensating for temperature exists for detecting small temperature changes with no electronic components at all in the sensor head. This makes use of the large change in static birefringence exhibited by most birefringent crystals when the temperature changes. The optical system for measuring thermally dependent birefringence is the same as that for measuring the birefringence induced by the Pockels effect. In this approach, a portion of the polarized laser beam is split off for the purpose of temperature sensing. In the field sensing head, a second crystal, oriented so that light passes through it at 90° to its optic axis, is mounted close to the Pockels crystal, and the two are maintained in thermal equilibrium by mounting them on a thermally conducting dielectric such as aluminum oxide. The split off laser beam is passed through the thermal sensing crystal and reflected back to an analyzer and photodectors on the ground, just as with the Pockels sensor. In this case temperature rather than electric field produces the changes in polarization.

A variety of values of the sensitivity constant $\alpha B/\alpha T$ (where B is birefringence) can be had by choosing among commonly available crystals. The material ADP (ammonium dihydrogen phosphate) has a large coefficient, $3.85 \times 10^{-5}$ per °C, while KDP (potassium dihydrogen phosphate) has the moderate value $1.04 \times 10^{-5}$ per °C, and quartz crystal has a small value $0.99 \times 10^{-6}$ per °C. The absolute phase shift is a function of the length of the crystal which is used. At 633 nm wavelength, the length of ADP required to yield a half cycle of variation for a $\Delta T_{1/2}$ of 0.1° C is 4.109 cm if the light is reflected back through the crystal. At the other extreme, a 1.52 mm thickness of quartz will produce a half cycle for a temperature change of 100° C, thus covering the entire operating range of the sensor. These are reasonable lengths, and these numbers indicate the sensitivity of this effect.

The above phenomenon may be used in a thermometer in a number of ways. The simplest and least costly approach is to use a single ADP crystal of 4.1 cm length with an electronic counter attached to the photodetector output. For each time the current crosses the half-maximum value, a threshold is tripped and a count (equivalent to 0.1° C) is registered. The light beam approaching the analyzer can be divided, with a quarter wave plate mounted over the half, and a separate detector used for each half of the beam, to detect whether the birefringence is increasing or decreasing, and therefore whether the temperature is rising or falling. Rising counts can be added, and falling counts substracted, to obtain the true temperature.

This scheme has only one drawback: if the counter is shut off or if the beam is interrupted, the temperature reference is lost, and since the effect is cyclic every 0.1° C there is no way of determining the absolute temperature if it has changed during the interruption.

A straightforward extension of this idea which preserves the digital nature of the above system and eliminates the cyclic ambiguity uses several crystals, each with its own photodetector and processing electronics. The sensitivity of each crystal is selected (by choosing appropriate materials and lengths) to differ from the others by factors of two. For example, the most sensitive crystal produces a current maximum every 0.2° C; the next, every 0.4° C; the next, every 0.8° C; and so on, until the least sensitive covers the full range of interest.

About 11 crystals would be required to cover a 100° C range with 0.1° C accuracy. The detector circuits would be digital, providing a "one" if the particular detector current is above 50% of maximum of a "zero" if it is below. Thus the least sensitive detector would indicate in which half of the full 100° C range the temperature lies; the next detector would indicate which half of that subrange contains the temperature, and so on.

For simplicity the crystals can be arranged in a compact cluster or array which can be illuminated by a single beam expanded to the appropriate diameter with a pair of lenses. A single analyzer can be used, and separation of the light from the various crystals onto the individual detectors can be accomplished by a single imaging lens behind the analyzer.

Figure 1:
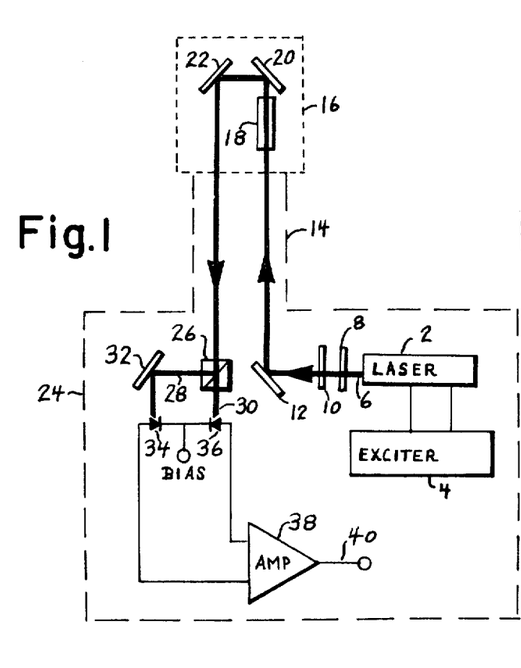
FIG. 1 is a simplified block diagram of a sensor according to the present invention.

In a system according to the invention, a sensor element is placed at the position in the field where the measurement is to be made, and laser light is projected onto the sensor from a remote transmitter station, as shown schematically in FIG. 1. The incident light is modulated by the sensor and returned to an optical receiver station, where the modulation is detected and the final measurement is actually carried out. In various applications the optical path can be through the open air, or in an enclosed path surrounded by an insulator, or even through a transparent fiber optical wave-guide if measurements must be made under adverse atmospheric conditions. In order to provide a maximum insensitivity to noise on the laser light source, optical misalignment, aging of system components, and other spurious effects, an optical polarization modulation system has been used. In such a system the sensor alters the polarization state of the laser beam and the change is detected using a beam-splitting polarizer and a pair of photodetectors arranged to measure orthogonal polarization components. Most spurious noise effects change the beam intensity but not its polarization. For this reason, polarization modulation techniques can provide a high degree of noise rejection. The modulation for the field measuring application is produced by field-induced optical birefringence or by polarization rotation in the sensor material. As one might expect, the linear effects, in which the induced birefringence or polarization rotation is proportional to the strength of the applied field, generally provide the greatest sensitivity and dynamic range. The preferred embodiments of the invention use two effects: the Pockels effect, in which an applied electric field induces a proportional birefringence, and the Faraday effect in which an optical polarization rotation increasing linearly with a component of applied magnetic field is obtained. In the past, these effects have been widely exploited in optical modulators and isolators; such applications generally involve an electrode structure or coil by which the fields are introduced, and the power which must be applied is to be minimized. Earlier work in the voltage sensing area has treated the case of ammonium dihydrogen phosphate Pockels cells and nitrobenzene Kerr cells with high voltage electrodes attached to the electro-optic medium. For current sensing, the Faraday effect in glasses has been considered for measuring large magnetic fields around conductors. The present invention is different in that the field exist over a large volume in space, no electrodes are used, the power required to maintain the field is not a consideration, and various possible materials can be used. These differences result in different figures of merit for the sensor media from those used in modulator device technology.

The Pockels or Faraday sensors are used as shown schematically in FIGS. A and B. In these diagrams, the input linearly polarized laser light is biased, either by a quarter-wave retardation plate producing circular polarization or by orienting the input polarization plane at 45° to the analyzer axes, so that, in the absence of a field, half the light leaves the system through each of the linearly polarized orthogonal output ports of the polarizing beamsplitter or analyzer. A photodetector is placed at each output port so that an unbalance in the intensities can be detected. Neglecting optical losses in the system and taking $P_0$ as the optical power input, then the output powers $P_1$ and $P_2$ leaving the beamsplitter are found by a straightforward polarization analysis to be:

$$P_1/P_0 = \tfrac{1}{2} + \tfrac{1}{2} \sin \Gamma \quad \text{Pockels Effect} \quad (8)$$
$$P_2/P_0 = \tfrac{1}{2} - \tfrac{1}{2} \sin \Gamma$$

$$P_1/P_0 = \tfrac{1}{2} + \tfrac{1}{2} \sin 2\theta \quad \text{Faraday Effect} \quad (9)$$
$$P_2/P_0 = \tfrac{1}{2} - \tfrac{1}{2} \sin 2\theta$$

where $\Gamma$ is the relative phase retardation induced by the electric field and $\theta$ is the polarization rotation induced by the magnetic field. For small $\Gamma$ and $\theta$ which vary sinusoidally in time the sensor therefore produces an intensity modulation index m which is approximately $$m \simeq \Gamma \quad (\Gamma << \pi/2) \quad 10.$$

or $$m \simeq 2\theta \quad (\theta << \pi/4) \quad 11.$$

for the two effects.

The ability to measure $m$ is fundamentally limited by shot and thermal noise in the photodetection process, and is affected in practice by intensity fluctuations on the laser output, mechanical vibration of optical components, and other spurious effects. Taking account of shot and thermal noise first, the fundamental limiting expression for the signal-to-noise ratio (S/N) at the output of one of the photodetectors is:

$$S/N = \frac{\tfrac{1}{2} I_s^2 R}{2eI_oBR + FkTB} \quad (12)$$

were R is the detector load resistance, e is the electronic charge, k is the Boltzmann constant, T is the absolute temperature of the detector, B is the bandwidth, and F is a detector amplifier noise figure. The peak value of the alternating signal photocurrent $I_s$ and average photocurrent $I_o$ are given by $$I_s = \frac{me\eta P_o}{2h\nu} \quad (13)$$

and $$I_o = \frac{e\eta P_o}{2h\nu} \quad (14)$$

where $h\nu$ is the photon energy and $\eta$ is the detector quantum efficiency. Currents in the detector other than photocurrent are neglected because a large average light level from the directly incident laser beam is always present. The minimum modulation index $m_o$ for which S/N is one is determined by the above relations to be $$m_o = \frac{2h\nu}{e\eta P_o} \left[ \frac{2e^2\eta P_o B}{h\nu} + \frac{2FkTB}{R} \right]^{1/2} \quad (15)$$

As a numerical example of the $m_o$ values to be expected, the following typical set of parameters can be evaluated:

$P_o = 10^{-3}$ watt } Helium-neon laser at 633 nm
$h\nu = 3.14 \times 10^{-19}$ joules $\eta = 0.1$ } Room temperature photodetector
$kT = 4.14 \times 10^{-21}$ joule B = 1000 Hz
R = 10,000 ohms
F = 2

The corresponding value for $m_o$ is $2.25 \times 10^{-6}$, limited almost equally by thermal and shot noise contributions in Eq. (15). Faster systems will be thermal noise limited as it becomes necessary to reduce R to extend the frequency response in the presence of capacitance at the preamplifier input.

Commercially available lasers typically have intensity modulation noise levels of the order of 1% of the full optical output power. It is clear then that in order to achieve the fundamental limit of sensitivity implied by Eq. (15), the system must reject common-mode intensity fluctuations in both detector channels by a factor of about 5000 for the numerical example given above. This can be done in principle by forming a signal proportional to the difference of the photodetector currents and then dividing this difference by the sum of the currents, a process which yields a differential ratio signal proportional to sin $\Gamma$ or sin $2\theta$ exactly. In practice the rejection of amplitude fluctuations depends on the balance that can be achieved between the two channels. Common mode rejection is limited by optical and photodetector responsivity characteristics rather than by the performance of the receiver electronics, at least for bandwidths below 100 kHz. For relatively wideband sensors such as transient detectors for fault location on power lines, requiring risetimes of the order of a microsecond, the shot and thermal noise would increase $m_o$ in the above example by roughly a factor of 100. However, the required accuracy in a system to detect the presence or time of arrival of transients is often poorer than for narrow band precision measurement systems; thus a loss in common mode rejection with increasing bandwidth can be tolerated in some applications.

When a dielectric crystal exhibiting the Pockels effect is placed in an electric field, the relative retardation induced on a transmitted laser beam is proportional to the magnitude of the electro-optic effect for the particular orientation of the field and the light, to the magnitude of the internal electric field induced in the crystal, and to the crystal length along the light beam. The internal field strength depends on the shape and dielectric constants for the crystal. With no electrodes attached, the field inside is also a function of frequency, since the finite resistivity of all media permits a charge relaxation effect to null out dc and very low frequency internal fields. All of these effects must be considered in selecting a sensor crystal for the applications considered here. We have concerned ourselves with crystals compatible with the 633 nm or 1152 nm wavelengths of the helium-neon laser. This choice was made because the useful lifetime of this laser is well over 10,000 hours and the silicon or germanium photodetector technology appropriate to these wavelengths is very well developed. Possible choices of electro-optic material include $LiNbO_3$, $LiTaO_3$, and members of the KDP (potassium dihydrogen phosphate) crystal family. In the KDP materials, the optic axis is the only direction in which an applied electric field produces a first-order relative retardation.

The following table lists relevant parameters for the crystals $LiNbO_3$, $LiTaO_3$, KDP, ADP (ammonium dihydrogen phosphate) and KD*P (deuterated KDP) with an assumed aspect ratio of 10 to 1. The arsenate isomorphs of KDP[18,19] have not been listed because their conductivities are too high for low frequency work. At frequencies higher than audio, the crystal CD*A (cesium dideuterium arsenate) may offer a marginal advantage over KD*P if sufficiently long samples of CD*A can be obtained.

ELECTRO-OPTIC MATERIAL PROPERTIES

| Material | $r_{ij} \times 10^{12}$ (m/V) | $n_o$ | $\epsilon$ | $M \times 10^{15}$ (m/V) |
|---|---|---|---|---|
| $LiNbO_3$ | $r_{22} = 7$ | 2.286 | $\epsilon_1 = 78$ | 2.16 |
| $LiTaO_3$ | $r_{22} = 1$ | 2.176 | $\epsilon_1 = 53$ | 0.39 |
| KDP | $r_{63} = 10.5$ | 1.508 | $\epsilon_3 = 21$ | 26 |
| KD*P | $r_{63} = 26.4$ | 1.504 | $\epsilon_3 = 50$ | 45 |
| ADP | $r_{63} = 8.5$ | 1.522 | $\epsilon_3 = 15$ | 24 |
| RDP | $r_{63} = 15$ | 1.506 | $\epsilon_3 = 28$ | 33 |

CRYSTALS OF THE KDP GROUP

| Crystal | $\epsilon_3$ | $R_3$ | $n_o^3 r_{63}$ meter/volt | $n_o^3 r_{63} R_3$ meter/volt |
|---|---|---|---|---|
| ADP | 15 | 0.78 | $29.6 \times 10^{-12}$ | $23.1 \times 10^{-12}$ |
| KDP | 21 | 0.71 | $36.3 \times 10^{-12}$ | $25.8 \times 10^{-12}$ |
| deuterated KDP (KD*P) | 50 | 0.5 | $70.8 \times 10^{-12}$ | $36.1 \times 10^{-12}$ |
| deuterated CsDA (CsD*A) (unpublished) | ~ 50 | ~ 0.5 | $139.5 \times 10^{-12}$ | ~ $70 \times 10^{-12}$ |

All of the above materials are widely available except CsD*A (deuterated cesium dihydrogen arsenate) which is only grown by Quantum Technology, Inc. of Toronto, Canada and is much more expensive than the others. We have listed CsD*A because it appears to have the largest figure of merit of any material studied if our assumption about the relative dielectric constant is correct. KD*P is the best of the readily available materials.

Choice of the best materials among these groups is basically determined by availability. Use of CsD*A is probably not justified in the face of its very high cost. Other Pockels materials are available widely and most of the cost is for polishing rather than for the bulk material. Therefore, KD*P is clearly the best choice.

On the basis of sensitivity, KD*P is the preferred Pockels effect material. As a numerical example of the sensitivity that is possible, consider a one-centimeter length of KD*P and a wavelength of 633 nm. An external electric field of 100 volt/meter (1 V/cm) would produce a modulation value of $4.5 \times 10^{-4}$, and it should be readily measurable under the conditions assumed earlier in our systems analysis. In fact with a 1 kHz bandwidth we should be able to measure modulation levels down to about 50 times smaller than this, or peak external field values of the order of $2 \times 10^{-2}$ V/cm. Since fields around high voltage transmission lines are of the order of $10^4$ V/cm or greater, the sensitivity of this measuring method is quite adequate. From an alternative point of view, the power density of a plane wave with a peak field of $2 \times 10^{-2}$ V/cm is 5.31 milliwatts per square meter, and this is the equivalent plane-wave noise level of the sensor.

Available optical materials providing a Faraday effect large enough to be useful for sensitive measurements of small magnetic fields can be classed into two groups. In one group are the paramagnetic and diamagnetic doped glasses which have specific rotations (Verdet constants) in the $10^{-5}$ to $10^{-4}$ radian-gauss$^{-1}$-cm$^{-1}$ range, losses less than a few percent per cm, and relative permeabilities near unity. In the other class are the rare earth iron garnets of which YIG ($Y_3Fe_5O_{12}$) is the only commercially available crystal, generally showing losses of the order of 1 cm$^{-1}$, transparent only in the near infrared, but with rotations about 100 times greater than the glasses and relative permeabilities of a few thousand. A third type of material, grouped with the glasses here, is the crystal terbium gallium garnet (TGG); this material has about twice the rotation of the best glasses, is transparent in the visible, and has low loss and permeability similar to the glasses. A new possibility, not yet readily available, is alumina silicate doped with terbium.

In all materials the Faraday rotation is proportional to the magnetic field component along the direction of optical propagation. For the glasses and for TGG, the shape of the modulator element is not important in determining the field inside, and a simple figure of merit M' is the specific polarization rotation V (rotation per unit field per unit length) divided by the loss per unit length $\alpha$. For YIG the situation is more complicated. Because of the presence of magnetic domains which must be aligned to obtain optical uniformity in YIG, a biasing field at right angles to the optical path must be employed. Since the magnetic susceptibility of the material is high below saturation, the shape must be accounted for by introducing appropriate depolarization (demagnetization) factors as in the case of the Pockels effect materials.

The following table summarizes data on the paramagnetic and diamagnetic glasses and TGG to compare with the above values. These materials can be used at 633 nm. Among the glasses the terbium alumina silicate composition is clearly superior, and among the commercially available compositions, Schott SFS-6 has the highest figure of merit, less than 7% of that for YIG. However, even to realize these M' values in actual practice, one must resort to long optical paths, probably by multipass techniques, to achieve the necessary effective lengths of a few tens of centimeters. Since YIG crystals over a centimeter in length are commercially available, no multipass geometry is necessary to realize the superior performance of YIG at 1152 nm. It is worth noting that if other iron garnet compounds, such as gadolinium iron garnets ($GdPr_2Ga_{0.5}Fe_{4.5}O_{12}$), were commercially available, figures of merit 5 to 10 times those of YIG might be expected. At this time it appears that YIG is the best material available, however, on the basis of sensitivity.

| Material | FARADAY MATERIALS AT 633 nm | | |
|---|---|---|---|
| | Specific Rotation V (radian-gauss$^{-1}$ cm$^{-1}$) | Loss $\alpha$ (cm$^{-1}$) | $M'=$/V/$\alpha$/ (radian-gauss$^{-1}$) |
| Schott SFS-6 glass | $+2.6 \times 10^{-5}$ | $9 \times 10^{-3}$ | $2.8 \times 10^{-3}$ |
| Corning 8363 glass | $+2.6 \times 10^{-5}$ | $30 \times 10^{-3}$ | $0.87 \times 10^{-3}$ |
| Dysprosium alumina silicate glass | $-6.4 \times 10^{-5}$ | about $10 \times 10^{-3}$ | $6.4 \times 10^{-3}$ |
| Praseodymium alumina silicate glass | $-6.1 \times 10^{-5}$ | about $10 \times 10^{-3}$ | $6.1 \times 10^{-3}$ |
| Terbium alumina silicate glass | $-7.3 \times 10^{-5}$ | about $5 \times 10^{-3}$ | $14.6 \times 10^{-3}$ |
| Hoya FR-5 glass | $-7.3 \times 10^{-5}$ | $3 \times 10^{-2}$ | $2.4 \times 10^{-3}$ |
| TGG | $-13 \times 10^{-5}$ | $7 \times 10^{-2}$ | $1.86 \times 10^{-3}$ |
| YIG | $190 \times 10^{-5}$ | $0.8$ | $40.6 \times 10^{-3}$ |

With a YIG sensor used in differential detection and a modulation index $m = 2 \times 10^{-6}$ being comparable to the noise, the minimum detectable Faraday rotation would be $10^{-6}$ radian. At a wavelength of 1152 nm and with a crystal one centimeter long and 2 millimeters in diameter, the minimum measurable magnetic field $B_{min}$ is $3.1 \times 10^{-5}$ gauss (19). Without differential electronic detection, the minimum modulation index limited by laser noise would be about $10^{-2}$ corresponding to a $B_{min}$ of 0.15 gauss. From the standpoint of applications to power transmission measurements, it is worth noting that the field at the surface of a standard 5-inch diameter conductor line carrying 1000 amperes of current is about 31.5 gauss.

In our experiments, we have used a rectangular bar of 90% deuterated KDP (i.e. KD*P), 3.1 × 3.1 × 25.4 millimeters with the long dimension parallel to the optic axis, and a circular rod of YIG, 3 mm in diameter and 12 mm in length along the [111] axis. The KD*P was obtained from Cleveland Crystals, Inc. and the YIG was obtained from Lambda Airtron Division of Litton Systems, Inc.

Since crystals of the KDP family are hygroscopic and must ordinarily be sealed in a dry environment, the KD*P crystal was in a cell of Teflon sealed with glass windows 3 mm thick on each end. The cell was 25 in diameter and 65 millimeters long, with a 4.5 millimeter diameter hole along its axis to accommodate the crystal. Teflon was chosen because of its low relative dielectric constant (about 2) and low water permeability. We used a laser operating at 633 nm, and a Wollaston prism both as polarizer and analyzer.

For either current or voltage sensing, the components can be separated into several functional modules (in some cases the same component can be used for different functions). With a linear-polarized laser, polarizers are not essential, but they might be desirable in high accuracy systems to ensure an exact alignment of the polarization in case of laser tube replacement or other maintenance. Similarly the use of the double-detector system is not necessary for relatively low accuracy or wideband applications.

The choice of placing the polarizer, waveplate and analyzer in the sensor module or in the transmitter/receiver modules is one of convenience. If fiber transmission is used, these components should be in the sensor module because polarization may be upset by passage through the fiber. In a free-space system there is some advantage in placing the analyzer in the receiver package if two detectors are used, in order to pass both output polarizations through the same optical path between the sensor and receiver stations.

Figure 2:
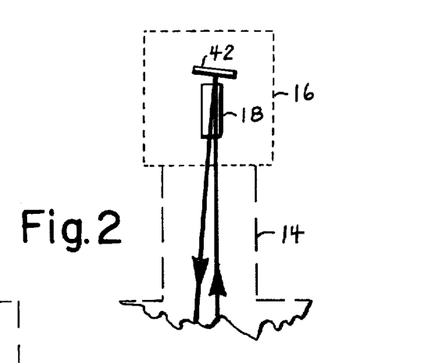
FIG. 2 is a diagram of a variation of the sensor of FIG. 1.
Figure 8:
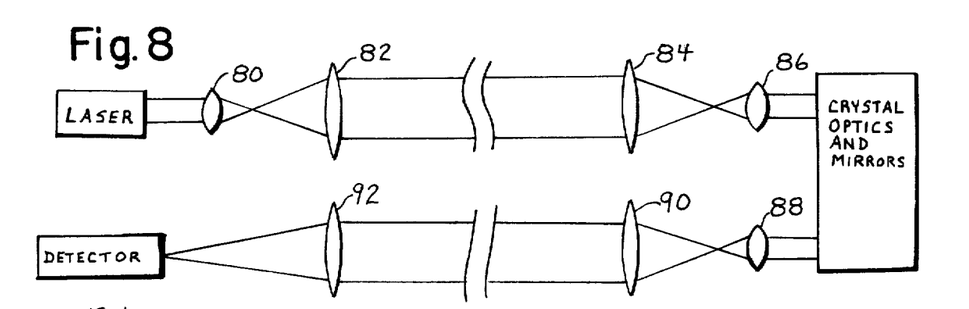
FIG. 8 is a diagram of a lens system for use with the invention to reduce the effects of vibration.

Lens systems were not shown in FIGS. 1 and 2. For free space propagation it may be necessary to expand the transmitted beam to about one centimeter diameter (the laser output is 0.1 to 0.2 cm diameter) in order to overcome effects of vibration or beam alignment tolerances. This would be done with a beam expander and beam reducer lens system (telescopes) as shown in FIG. 8. The lenses used would be larger than the laser beam so that small amounts of misalignment could be tolerated without power loss. Simple lenses can be used with good results in such systems, and frequently the cost of the lenses is less than the cost of the antireflection coatings needed to reduce reflection losses. For best efficiency, all optical surfaces would be coated for minimum reflection at the laser wavelength.

In the high speed application, it is important to achieve moderately low detector capacitance. Silicon junction photodiodes with areas of approximately 1 mm$^2$, used in a backward-biased circuit, are satisfactory. For limited bandwidth applications, additional freedom from alignment tolerances can be achieved with detectors with a large area of perhaps 0.5 cm in diameter. For work at 1.15 micrometers, germanium diodes yield high (about 60%) quantum efficiencies, but their leakage current and noise is higher than for silicon.

For the fault locator, receiver electronics can consist of a wideband preamplifier (signals of the order of a few millivolts into 1000 ohms may be typical inputs), a differentiator circuit to obtain the leading edge of the transient, and a threshold detector which puts out a standard pulse if a fast transient larger than a preset magnitude appears. The time waveform can also be obtained simultaneously from the preamplifier if desired.

For high accuracy uses such as metering, there are two detectors and preamplifiers, followed by sum, difference, and ratio forming circuits to obtain a quantity proportional to $$I_1 - I_2/I_1 = I_3 \qquad 16.$$

where $I_1$ and $I_2$ are the photocurrents out of the two detectors or their preamplifiers. Since it may be necessary to compensate for the sensor crystal temperature if it is not independently stabilized, a temperature-controlled variable gain might also be needed. Of course all critical circuits must be designed to maintain constant gain in the presence of any environmental changes and aging.

Figure 4:
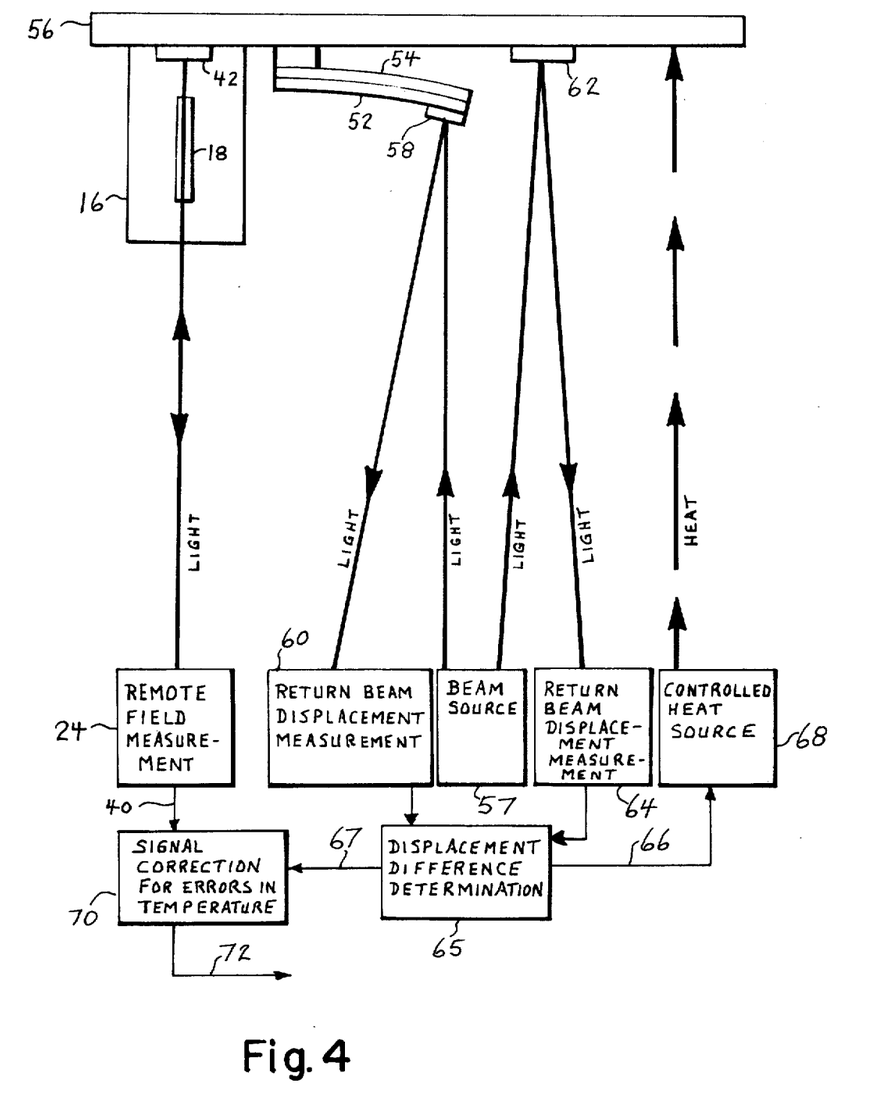
FIG. 4 is a block diagram of a system according to the invention, including temperature compensation.

A simple thermometer based on differential linear expansion of two dielectric strips, is shown in FIG. 4, with one end fixed and the other end free with a small optically flat mirror attached. Thermometers are frequently constructed of two metal strips soldered together in this configuration. For present purposes, dielectric materials are more desirable. A small deflection angle that can be read remotely as a moving reflected light spot is all that is needed.

A few simple calculations suffice to demonstrate the feasibility of this approach. The deflection angle $\beta$ ($\Delta T$) produced by a temperature change $\Delta T$ is given by $$\beta (\Delta T) = L/d\, (\alpha_1 - \alpha_2) \Delta T \qquad 17.$$

where L is the length of the strips, d is the thickness of one of the strips, and $\alpha_1$ and $\alpha_2$ are the linear expansion coefficients of the two materials of which the strips are made. A light beam reflecting from a mirror attached to the free end of the strip will be defected through an angle $\theta = 2\beta(\Delta T)$. If h is the height of the sensor above the receiver station on the ground, the spot reflected back to the receiver will move through a distance of approximately $x = h\theta$ as a result of the temperature change $\Delta T$. If a laser beam is used, the minimum spot diameter that can be produced at the receiver is limited by diffraction, and is $$\Delta x \simeq \lambda h/D \qquad 18.$$

where D is the diameter of the mirror mounted on the strip and $\lambda$ is the laser wavelength. The minimum temperature change that can be resolved is therefore $$\Delta T_o = \frac{\lambda d}{2DL(\alpha_1 - \alpha_2)} \qquad (19)$$

independent of the distance h.

As a numerical example, a thermometer is constructed from two strips, 50 mm long and 1 millimeter thick, one of ordinary glass with $\alpha_1 = 8 \times 10^{-6}\,°\text{C}^{-1}$ and one of pyrex with $\alpha_2 = 3 \times 10^{-6}\,°\text{C}^{-1}$. The angle $\theta_1$ produced by a 1° temperature change is then $5 \times 10^{-4}$ radians. A mirror about 7 mm in diameter on the end of the strip will produce a diffraction-limited beam divergence $\beta_D \simeq \Delta x/h$ of about $10^{-4}$ radians at $\lambda = 633$ nm. Such a system is therefore capable of displaying a 0.2° C temperature change at any height.

The small angle sensitivity of this system would be a problem if there were warping or thermal distortion of the structure that supports the sensor head. To eliminate this problem, a fixed mirror is mounted next to the moving mirror so that two reflections are returned to the ground. The distance between these reflections is a measure of the temperature, whatever the orientation of the sensor head.

To estimate the size of the laser beam on the ground, if we assume that h is as large as 7 meters, the spot size will be $h\beta_D = 0.7$ mm or about 0.028 inch, a reasonable size. The total deflection for a 100° C temperature range would be about 35 cm, a value that is also reasonable.

Servo control of the sensor temperature is also a possible means of achieving the desired accuracy. In any thermal servo, there is a source of heat applied to the sensor head, a heat sink into which this heat is dissipated, and a thermometer sensor which is used to control the heat source. Since this must be a wireless system, the usual approach of applying electrical power and sensing temperature by means of resistance change in a sensor element such as a thermistor cannot be used. In the present case, the temperature can be sensed by any of the methods described earlier, and heat can be applied either through circulation of a dielectric fluid (e.g. hot air or hot $SF_6$ gas pumped through a glass tube, with heat supplied at the ground) or directly by radiant transfer.

Radiant transfer, or heating of the sensor by an optical beam from the ground can be a very efficient means of providing the input power to maintain thermostatic equilibrium, with no moving parts to break down or wear out. A 1 square centimeter tungsten ribbon or filament near 2500° K (a very conservative temperature for long life) will radiate about 150 watts of power, 95% of which is in the infrared. If only 10% of this is picked up by a mirror and focused on a collector, which might be another mirror or just a black target, mounted in the sensor head, 15 watts would be transported across this short distance with no wires and negligible time lag. With reasonable design of the supporting structure for the sensor crystals, a maximum power of 15 watts probably can be made to provide an adequate temperature rise above the heat sink under almost any conditions.

The accuracy with which such a system can control temperature depends on the rate of heat input, the sensor heat capacity, and the time lag between collection of the heat by the target and distribution of the heat to the thermal control sensor. In a typical system, the temperature oscillates about the control value because of this time lag. By appropriate insulation of the Pockels or Faraday effect devices from the surface of the collector, it may be possible to damp out the effect of these oscillations sufficiently to hold the temperature within a few tenths of a degree.

DESCRIPTION OF THE PREFERRED EMBODIMENTS

FIG. 1 is a simplified block diagram of a sensor according to the present invention. A laser 2, driven by an exciter 4, emits a beam 6 of coherent light through a polarizer 8 and a quarter-wave plate 10. Note that the polarizer is not needed if the laser itself is linearly polarized. The beam is reflected by a mirror 12 through a support column 14 to an inactive (non-powered) head 16. Column 14 may be a tube of Pyrex filled with $SF_6$. In head 16, the beam makes a single pass through a field-sensitive optical element 18, which may be a Pockels-effect or Faraday-effect element, and is then reflected back down the support column by mirrors 20 and 22. These mirrors may be embodied in a single 45 degree right prism with the equal sides silvered. After returning to the section 24 of the device which is electrically isolated from head 16, the beam passes through an analyzer prism 26, where the beam is divided into two components 28 and 30, which are displaced by 90 degrees with respect to each other. Beam component 28 is reflected by a mirror 32 to impinge upon a first photodiode 34. Beam component 30 impinges upon a second photodiode 36. Signals developed by the two photodiodes are applied to a differential amplifier 38 to develop an output signal on line 40 which is proportional to the strength of the field crossing element 18.

FIG. 2 is a partial block diagram of a variation of the embodiment of FIG. 1. The beam, after passing once through element 18, is reflected by a mirror 42 back through element 18 toward prism 26. By using two passes through element 18, this embodiment doubles the sensitivity of the crystal.

Figure 3:
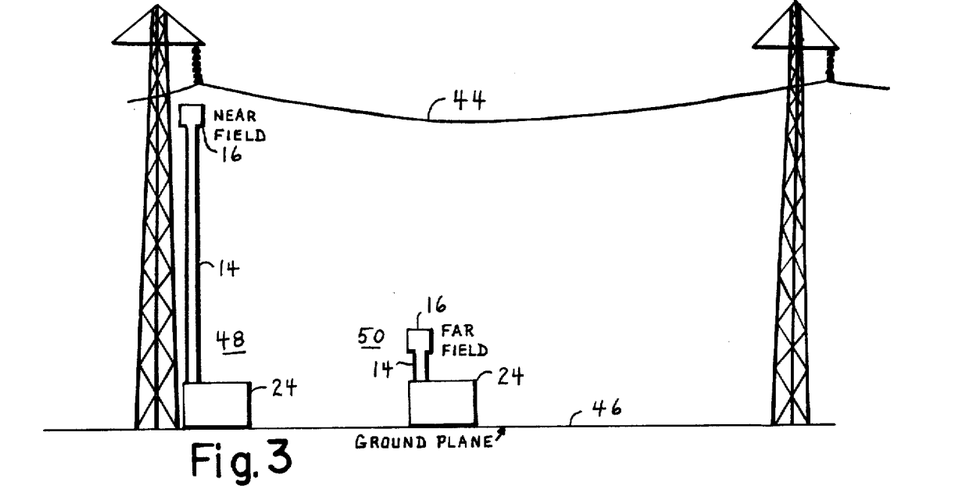
FIG. 3 is an extremely simplified diagram of two devices according to the present invention, used to measure the near field and the far field of a power line.

FIG. 3 is an extremely simplified diagram of two devices according to the invention, located between a high voltage power line 44 and a ground plane 46. The first device 48 is situated to measure the near field of the power line and the second device 50 is situated to measure the far field of the line. The fields around extremely high voltage power lines are usually strong enough to measure from the ground below the line, but better distinctions between adjacent lines can be made by measuring the near fields. When near fields are measured, total electrical isolation is necessary in order to protect operators and equipment at ground level from the dangerous voltage levels around the line.

FIG. 4 is a block diagram of a system according to the invention, including temperature compensation. As in FIGS. 1 and 2, a laser system in an isolated section 24 directs a beam of light to a head 16, where it goes through a Faraday-effect or Pockels-effect element 18 and is reflected back to the isolated section 24 by a mirror 42. In practice, the same laser may be used with a beam splitter to provide a beam for both a Faraday-effect and a Pockels-effect sensor.

A beam-type temperature sensing element constructed of two non-conductive strips 52 and 54 having different temperature coefficients of expansion is mounted on a common thermally conductive support 56 with the field-sensitive element 18. A beam source 57 directs a beam at the temperature sensitive element. A mirror 58 reflects the returned beam of light to a displacement system 60, where the displacement provides an indication of the temperature in the vicinity of the field-sensitive element. Numerous devices for measuring the displacement of a beam are available, one of the simplest being a V-shaped mask over a photosensitive element, whereby the displacement affects the amplitude of the signal produced by the photosensitive element. Beam source 57 may use the same laser 2 as is used in isolated section 24, together with beam splitters to separate off a portion of the beam for use in temperature measurement.

Because vibrations or skewing of the support 56 may cause errors in the displacement measurement, an additional mirror 62 is provided and mounted in a fixed position on the support. A beam is directed at mirror 62 and the displacement of its returned beam is measured in an element 64. The actual temperature measurement is derived by subtracting the value obtained in measurement element 64 from the value obtained in measurement element 60, after which the actual temperature is compared in a comparator 65 with a desired temperature to derive a temperature error signal on lines 66 and 67 which may be used in either (or both) of two ways. The error signal may drive a heat source 68 to heat the support 56 to a desired value. The error signal may also be multiplied by a weighting factor based on the temperature coefficient and the weighted error signal may be used to modify the amplitude of the signal on line 40 in a signal corrector 70 to correct for the temperature errors. Preferably, a combination of the two error correction methods will be used to keep the temperature-sensitive element within a small range in which it can operate linearly. The heat source may direct heated $SF_6$ at the support through the hollow support column, or it may direct a focused or collimated beam of heat, such as infrared light, at the support. Finally, a signal from corrector 70 on line 72 represents the corrected field values.

Figure 5:
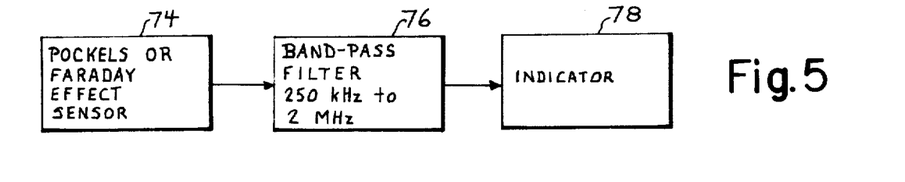
FIG. 5 is a block diagram of a transient measurement system according to the invention.

FIG. 5 is a block diagram of a transient-measurement system according to the present invention in which temperature compensation is not needed. Using a Pockels-effect or Faraday-effect sensor 74 according to FIG. 1 or FIG. 2, the output signal is passed through a band-pass filter 76. When the filter is set up to eliminate all values below about 250 to 500 KHz (to eliminate switching frequencies) and above about 1 to 2 MHz (to eliminate lightning), then the only signals which pass are line-fault transients. Signals indicative of these line fault transients are passed on to an indicator element 78. Since the transients occur so rapidly, no temperature compensation is needed.

Figure 6:
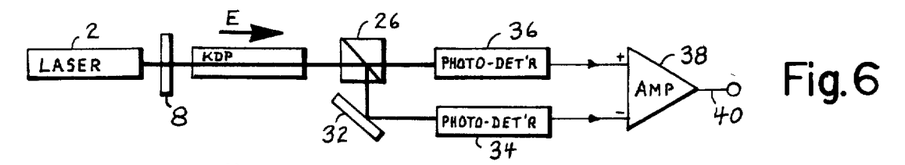
FIGS. 6 and 7 are block diagrams of systems using polarized lasers for electric field measurement using KDP and magnetic field measurement using YIG.
Figure 7:
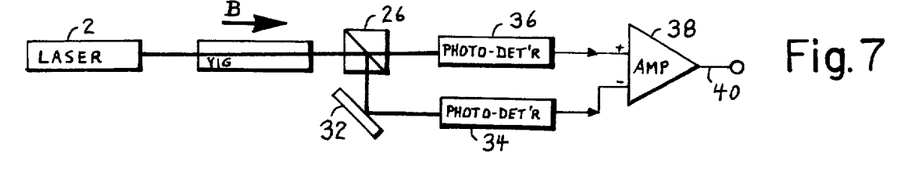

FIGS. 6 and 7 use polarized lasers 2 and illustrate specific use of a KDP-type crystal to measure an electrical field E and of a YIG crystal to measure a magnetic field B.

Because of vibration problems, it may be difficult to maintain the aim of the beam without a lens system. In FIG. 8, an embodiment is illustrated using lenses 80, 82, 84, 86, 88, 90 and 92, the first six of which are in simple telescope arrangements. Thus the aiming accuracy of the beam can be more easily maintained.

Figure 9:
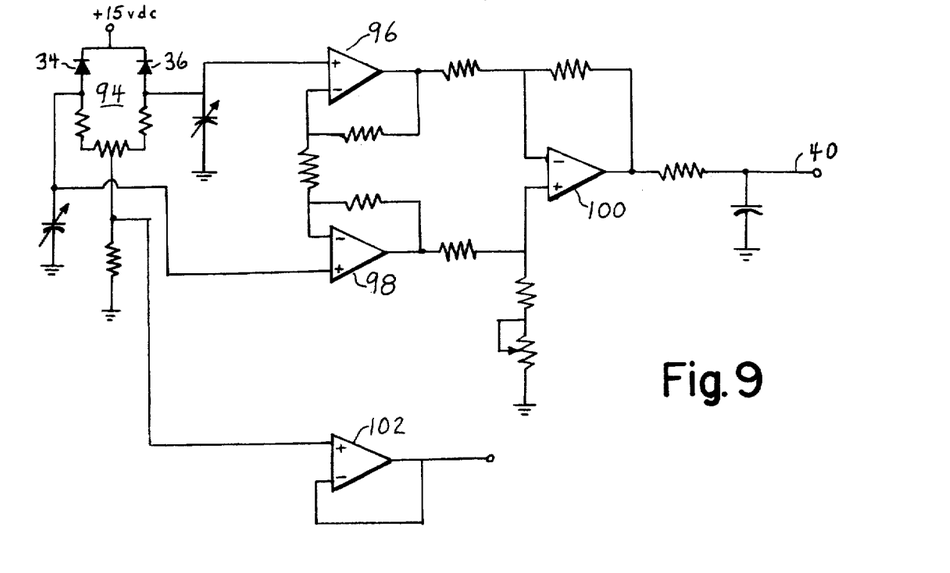
FIG. 9 is a diagram of an amplifier circuit for use in the invention.

FIG. 9 gives a more detailed diagram of an amplifier circuit which can be used as element 38. Photodiodes 34 and 36 are used in a bridge circuit 94 to feed opposite sides of a difference amplifier constructed of amplifier elements 96, 98 and 100, providing an output on line 40. A sum output is also provided by an amplifier 102.

What is claimed is:

1. In a system for measuring a field in the vicinity of a high-voltage power transmission line comprising:
  A. a field-sensitive optical element located in the field,
  B. light-source means for directing a polarized beam of coherent light through the optical element, and
  C. direction-measurement means for measuring the direction of polarization of the beam which emerges from the optical element to derive a signal indicative of field strength,
  the improvement comprising:
  D. temperature-measurement means for measuring the temperature of the optical element in comparison with a predetermined temperature level to derive an error signal, and
  E. correction means responsive to the error signal for eliminating errors in the field-strength signal.

2. A system according to claim 1 wherein the correction means comprises a heat source controlled by the error signal to reduce the error signal toward zero by driving the actual temperature of the optical element toward the predetermined temperature level.

3. A system according to claim 1 wherein the correction means comprises means for electrically combining a weighted value of the error signal with a measured value of the field-strength signal.

4. A system according to claim 1 wherein the direction-measurement means further comprises:
   A. means for dividing the beam which emerges from the optical element into two components whose polarizations are perpendicular to each other,
   B. two photosensitive means, one such means responsive to each of the two components, for providing respective electrical indications of the intensity of each component, and
   C. differential amplifier means responsive to the respective electrical indications for providing an electrical output signal indicative of polarization in which beam intensity variations tend to cancel each other out.

5. A system according to claim 1 further comprising a lens system for carrying the beam from the light-source to the optical element and from the optical element to the direction measurement means.

6. A system according to claim 1 further comprising a mirror means for returning the beam from the location of the optical element to the direction-measurement means.

7. A system according to claim 6 wherein the mirror means reflects the beam as it emerges from the optical element so that it passes back through the optical element on the way to the direction-measurement means.

8. A system according to claim 1 wherein the field is an electric field and the optical element is chosen from the group consisting of potassium dihydrogen phosphate, deuterated potassium dihydrogen phosphate and deuterated cesium dihydrogen arsenate.

9. A system according to claim 1 wherein the field is a magnetic field and the optical element is chosen from the group consisting of rare-earth iron garnets, $GdPr_2 Ga_{0.5}Fe_{4.5}O_{12}$, and glass doped with a rare earth.

10. A system for measuring transients in the field of a high-voltage power transmission line caused by faults in the line comprising:
    A. a field-sensitive optical element located in the field,
    B. light-source means for directing a polarized beam of coherent light through the optical element,
    C. means for measuring the direction of polarization of the beam which emerges from the optical element of derive a signal indicative of field strength,
    D. filter means for passing components of said signal no lower than 250 KHz and no higher than 2 MHz indicative of transients on said line, and
    E. indication means responsive to the signals thus passed.

* * * * *